(12) United States Patent
Melanson

(10) Patent No.: US 6,744,392 B2
(45) Date of Patent: Jun. 1, 2004

(54) NOISE SHAPERS WITH SHARED AND INDEPENDENT FILTERS AND MULTIPLE QUANTIZERS AND DATA CONVERTERS AND METHODS USING THE SAME

(75) Inventor: John Laurence Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 30 days.

(21) Appl. No.: 10/211,847

(22) Filed: Aug. 2, 2002

(65) Prior Publication Data

US 2004/0021594 A1 Feb. 5, 2004

(51) Int. Cl.[7] ............................................... H03M 3/00
(52) U.S. Cl. ..................... 341/143; 341/144; 341/155; 341/118; 341/120
(58) Field of Search ............................. 341/143, 144, 341/118, 120, 159, 150, 155, 200, 126, 131

(56) References Cited

U.S. PATENT DOCUMENTS

| | | | | |
|---|---|---|---|---|
| 6,107,947 A | * | 8/2000 | Lyden | 341/143 |
| 6,346,898 B1 | * | 2/2002 | Melanson | 341/143 |
| 6,426,714 B1 | * | 7/2002 | Ruha et al. | 341/143 |
| 6,515,607 B2 | * | 2/2003 | Liu et al. | 341/143 |

\* cited by examiner

Primary Examiner—Brian Young
Assistant Examiner—John Nguyen
(74) Attorney, Agent, or Firm—James J. Murphy; Winstead Sechrest & Minick P.C.

(57) ABSTRACT

A noise shaper including first and second quantizers and first and second feedback paths each providing feedback from a corresponding quantizer output. A loop filter system implements a plurality of transfer functions including a first non-zero transfer function between the first feedback path and an input of the first quantizer, a second non-zero transfer function between the first feedback path and an input of the second quantizer, a third non-zero transfer function between the second feedback path and the input of the first quantizer and a fourth non-zero transfer between the second feedback path and the input the second quantizer.

39 Claims, 11 Drawing Sheets

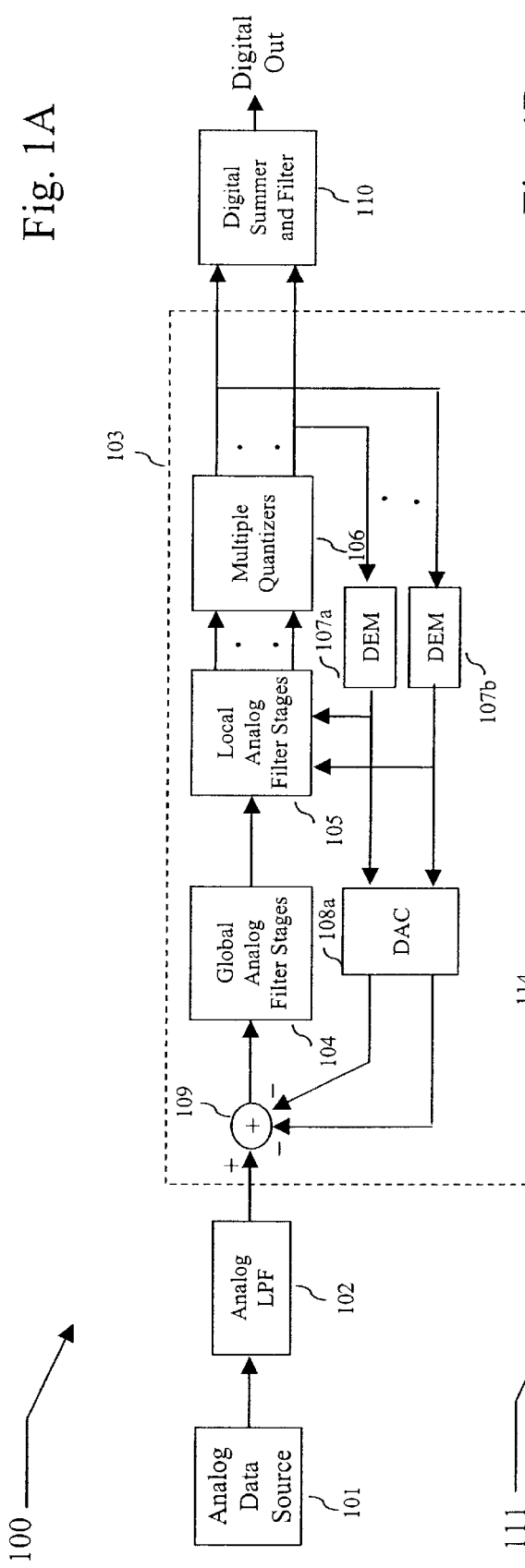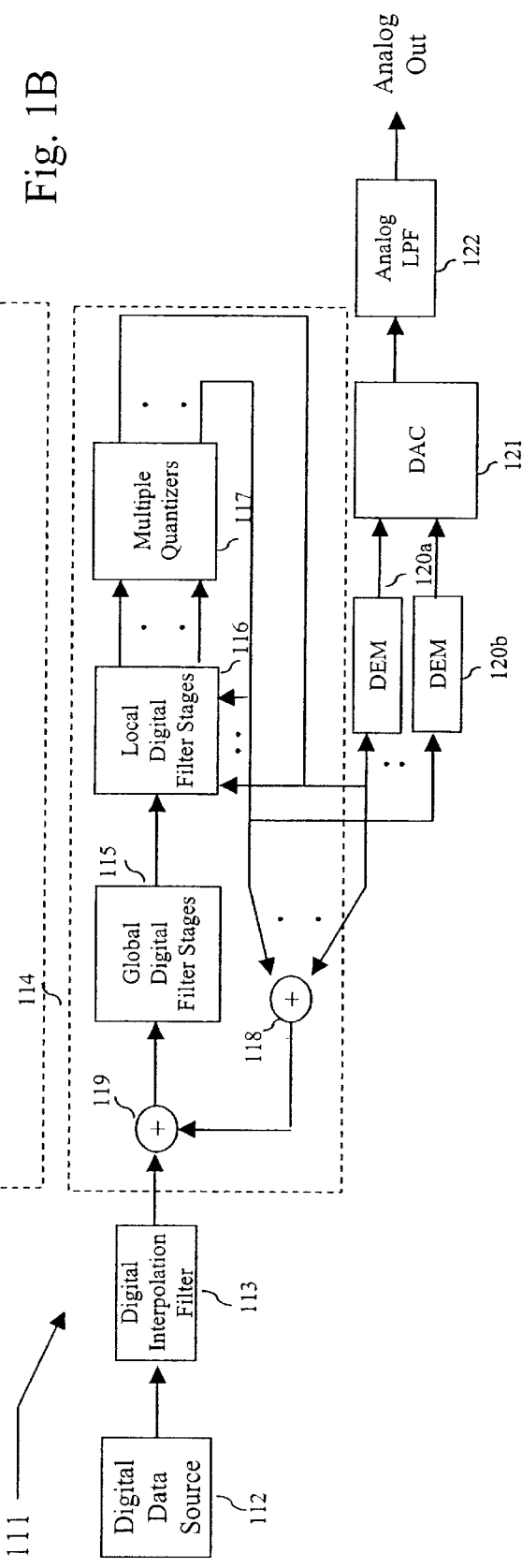

NOISE SHAPERS WITH SHARED AND INDEPENDENT FILTERS AND MULTIPLE QUANTIZERS AND DATA CONVERTERS AND METHODS USING THE SAME

BACKGROUND OF THE INVENTION

1. Field of Invention

The present invention relates in general to delta-sigma modulators and in particular, to noise shapers with shared and independent filters and multiple quantizers and data converters and methods using the same.

2. Background of Invention

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta sigma modulator performs noise shaping by acting as a highpass filter to the noise; most of the quantization noise power is thereby shifted out of the signal band.

The typical delta sigma modulator in an ADC includes an input summer which sums the analog input signal with negative feedback, an analog linear (loop) filter, a quantizer and a feedback loop with a digital to analog converter (feedback DAC) coupling the quantizer output and the inverting input of the input summer. A delta-sigma DAC is similar, with a digital input summer, a digital linear filter, a digital feedback loop, a quantizer and an output DAC at the modulator output. In a first order modulator, the linear filter comprises a single integrator stage; the filter in higher order modulators normally includes a cascade of a corresponding number of integrator stages. Higher-order modulators have improved quantization noise transfer characteristics over modulators of lower order, but stability becomes a more critical design factor as the order increases. For a given topology, the quantizer may be either a one-bit or a multiple-bit quantizer.

The feedback DACs in multi-bit delta-sigma ADCs, as well as the output DACs in multi-bit delta-sigma DACS, are typically constructed from weighted conversion elements. Each conversion element converts one digital bit into a weighted-step analog voltage or current. The currents or voltages generated by the weighted conversion elements for the digital word being converted are then summed to generate the analog output signal. Mismatch between conversion elements, however, causes the weighted steps of current or voltage to deviate from their ideal weighted-step values. Element mismatch results in mismatch noise and distortion in the output signal. Consequently, dynamic element matching (DEM) circuitry is normally included at the DAC inputs which spreads the mismatch noise across the analog output signal band.

For example, a number of well-known DEM designs including barrel-shifting, individual level averaging, butterfly routing, and data weighted averaging, exist. DEM circuits however do have significant drawbacks. Also, in multiple-bit modulators the DEM circuitry is relatively large, especially in high voltage ADCs requiring a large fabrication geometry. In addition, a tendency for the DEM circuit to become tonal exists, and the DEM circuit is typically a low order, delta-sigma modulator.

Hence what is needed are techniques which address the problem of mismatch between data conversion elements in DACs and ADCs. Such techniques should, for example, eliminate or minimize the DEM circuitry required in the given DAC or ADC.

SUMMARY OF INVENTION

The principles of the present invention generally apply to noise shapers with multiple quantizers and shared and independent filter functions. In one representative embodiment, a noise shaper is disclosed including first and second quantizers and first and second feedback paths each providing feedback from a corresponding quantizer output. A loop filter system implements a plurality of transfer functions including a first non-zero transfer function between the first feedback path and an input the first quantizer, a second non-zero transfer function between the first feedback path and an input of the second quantizer, a third non-zero transfer function between the second feedback path and the input of the first quantizer and a fourth non-zero transfer between the second feedback path and the input the second quantizer.

Noise shapers embodying the inventive principles have substantial advantages over the prior art. For example, modulators with both shared and independent filter stages and multiple-quantizers allow for the characterization of both global noise shaping across all modulator outputs and local noise shaping at individual modulator outputs. Global noise shaping is the ability of the delta-sigma modulator to shape the total quantization noise spectrum generated by the sum of the output spectrums of the multiple quantizers. Local noise shaping is the ability of the delta-sigma modulator to shape the spectrum of the difference of the spectrums output from the multiple quantizers. In other words, global noise shaping characterizes the overall shaping modulator output spectrum and local noise shaping allows the difference noise spectrum exposed to mismatch in the following conversion elements to be shaped. Generally, an improvement in global noise shaping results in a reduction in the local noise shaping capability, and vice versa. Furthermore, the inventive principles may be applied to a number of different modulator topologies, including feedforward, feedback, and combination feedforward—feedback topologies.

BRIEF DESCRIPTION OF DRAWINGS

For a more complete understanding of the present invention, and the advantages thereof, reference is now made to the following descriptions taken in conjunction with the accompanying drawings, in which:

FIG. 1A is a high-level functional block diagram of an exemplary delta-sigma analog to digital converter (ADC) system embodying the principles of the present invention;

FIG. 1B is a high level functional block diagram of an exemplary digital to analog converter (DAC) system embodying the principles of the present invention;

DETAILED DESCRIPTION OF THE INVENTION

Figure 2:
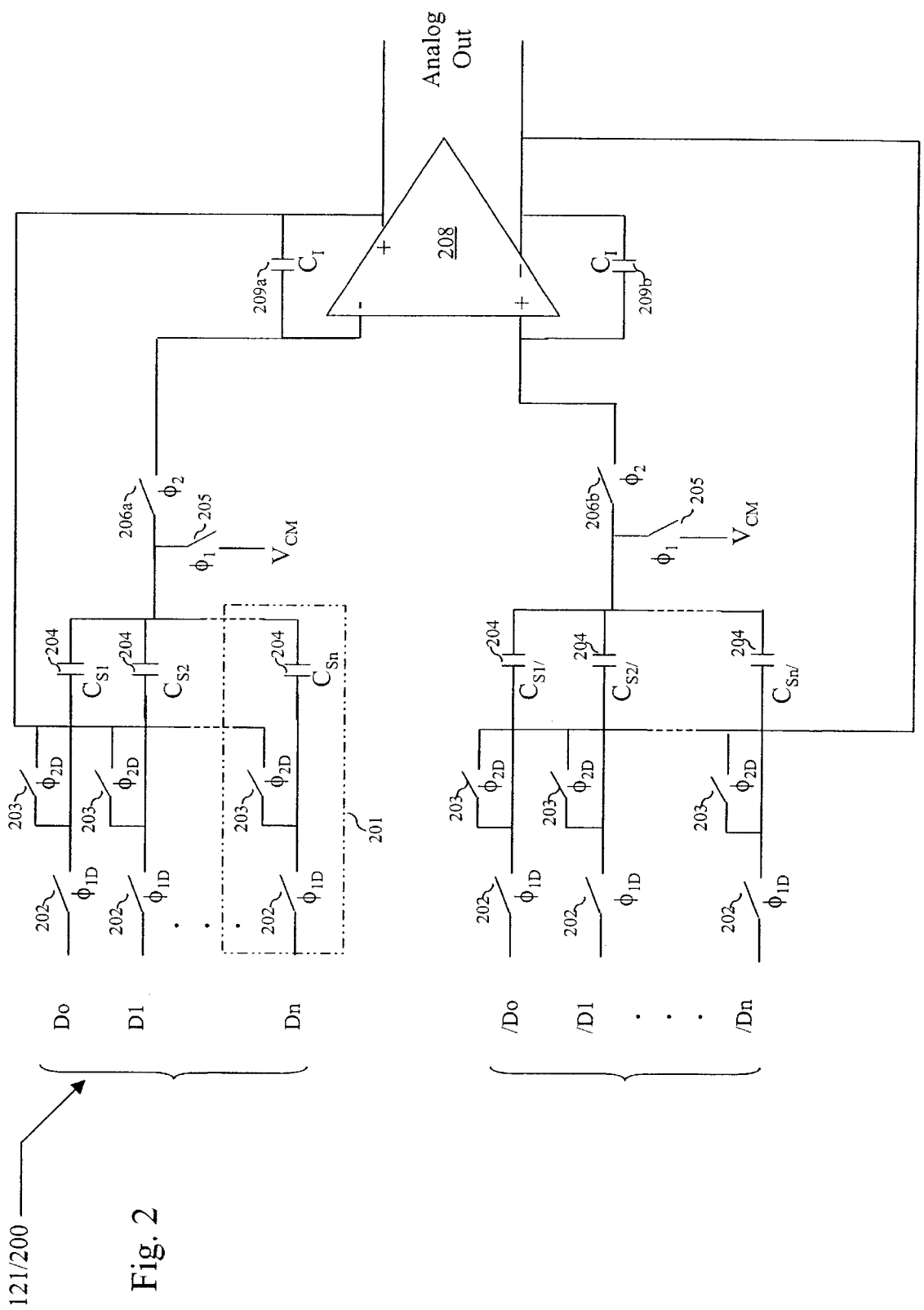
FIG. 2 depicts an exemplary switched capacitor output DAC, which may be utilized in the DAC of FIG. 1B, FIGS. 3A AND 3B depict an exemplary switched-capacitor feedback DAC, which may be utilized in the DAC of FIG. 1A.

The principles of the present invention and their advantages are best understood by referring to the illustrated embodiment depicted in FIGS. 1–10 of the drawings, in which like numbers designate like parts.

FIG. 1A is a high-level functional block diagram of an exemplary delta-sigma analog to digital converter (ADC) system 100 embodying the principles of the present invention. ADC 100 is useful in a number of signal processing data acquisition, and similar applications requiring the conversion of analog signals from a given analog source 101 into the digital domain.

The input analog signals are passed through an analog low-pass anti-aliasing filter 102 which removes out-of-band signals and noise that would otherwise fold back into the signal baseband during subsequent modulation. Modulation is performed in a delta-sigma modulator (noise shaper) 103, which according to the inventive principles includes a set of global (shared) analog filter stages 104, a set of local analog filter stages 105, and multiple quantizers 106. (In FIG. 1A, global filter stages 104 are shown in front of local filter stages 105 and quantizers 106; as will be discussed below, this ordering varies depending on the specific noise shaper topology). The modulator feedback loop includes optional dynamic element matching (DEM) circuitry 107, a feedback DAC 108 and an input summer 109. The output from multiple quantizers 106 are summed and digitally filtered in output stage 110. Exemplary delta-sigma modulator topologies embodying the inventive principles and suitable for use in analog noise shapers such as modulator 103 of ADC 100 are discussed in detail below.

The inventive principles are also be embodied in digital delta-sigma modulation applications such as exemplary digital-to-analog converter (DAC) system 111 shown in FIG. 1B. In DAC 111, digital data from a digital data source 112, such as a compact disk (CD) or digital versatile disk (DVD) player, are passed through a digital interpolation filter 113 which increases the sampling rate by a given oversampling factor. The upsampled data are then noise shaped by a digital delta-sigma modulator 114.

The exemplary modulators discussed below, using digital stages, are also applicable to digital applications such as digital delta-sigma modulator 114. Generally, digital delta-sigma modulator 114 includes a set of global (shared) digital filter stages 115, a set of local (independent) digital filter stages 116, and multiple quantizers 117. The digital data output from quantizers 117 are summed by feedback summer 118 which provides the negative feedback to modulator input summer 119. (Again, as discussed further below, the order of global stages 115, local stages 116, and quantizers 117 varies depending on the modulator selected). The converter system output stages include optional DEM circuit 120a and 120b, an output DAC 121, (e.g., a switched-capacitor or current steering DAC), and an analog low pass filter 122.

Some non-zero mismatch occurs between the elements of feedback DAC 108, in the case of delta-sigma ADC system 100, or between the elements of output DAC 121, in the case of delta-sigma DAC system 111. For purposes of illustrating element mismatch in feedback DAC 108 and output DAC 121, exemplary electrical schematic diagrams of multiple-bit switched-capacitor output and feedback DAC 200 and 300 are respectively shown in FIGS. 2 and 3. (Element mismatch occurs in other types of DACs, such as current steering DACs, as well; switched-capacitor DACs have been chosen for illustrative purposes). An exemplary switched capacitor output DAC 200, which may be utilized for DAC 121 of FIG. 1B, is shown in FIG. 2, and an exemplary switched-capacitor feedback DAC 300, which may be utilized for DAC 108 of FIG. 1A, is shown in FIGS. 3A and 3B.

Figure 3A:
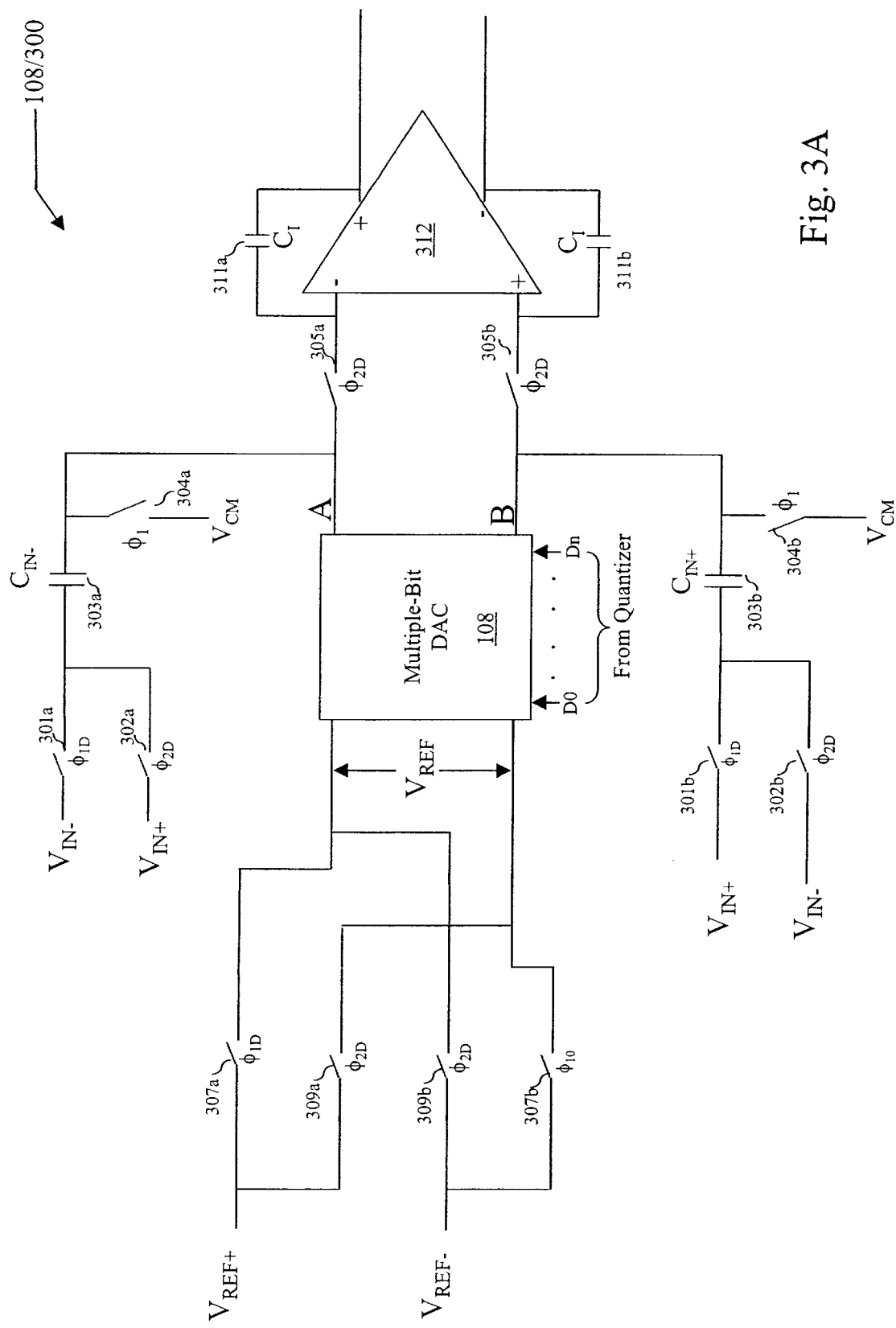
Figure 3B:
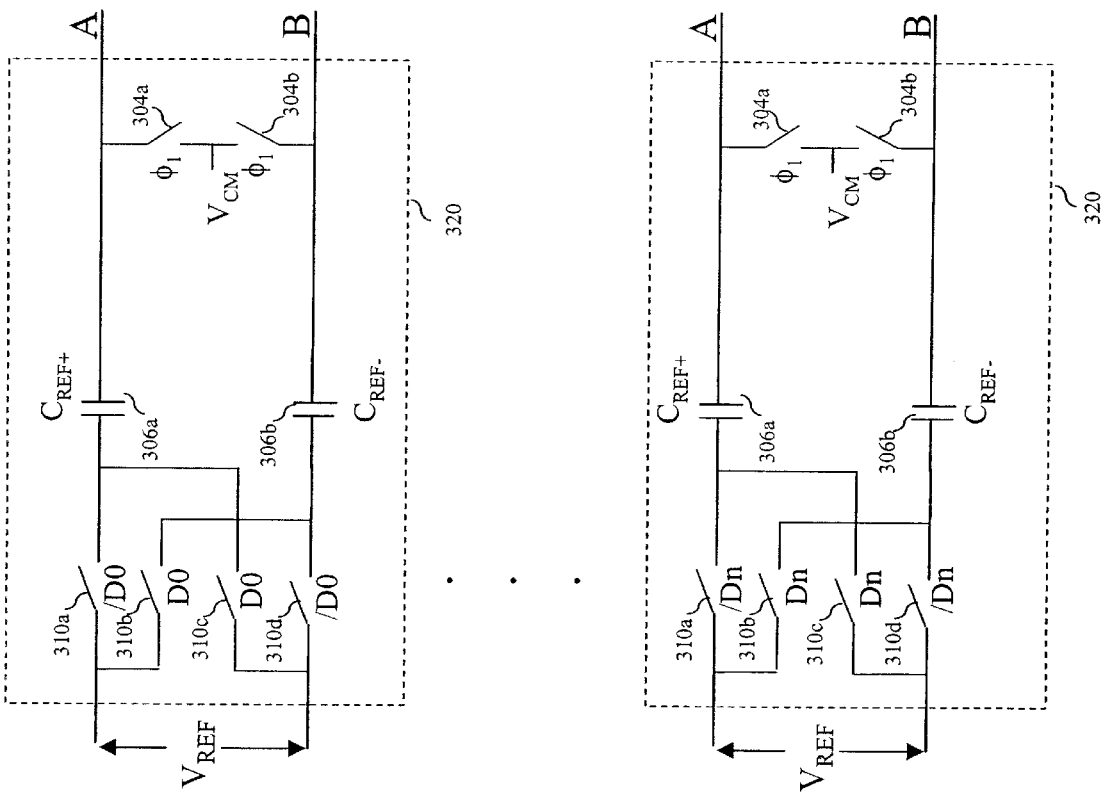

FIG. 2 depicts an output DAC 200 operating on quantized digital samples of n+1 number of bits, in which n is an integer greater than one. Data conversion on the input bits D0–Dn and the complementary bits /D0–/Dn is performed by a corresponding set of conversion elements 201. If input bits D0–Dn and complementary bits /D0–/Dn are thermometer encoded, each element 201 has unit weight and includes an input sampling switch 202 for sampling charge onto a corresponding sampling capacitor 204 (Cs) during the sampling phase ($\phi_1$) and a second switch 203 for forcing charge from sampling capacitor 204 during the integration phase ($\phi_2$). Switches 205 couple the opposing plates of sampling capacitors (Cs) 204 to the common mode voltage (Vcm) during sampling and switches 206 pass charges from sampling capacitors 204 to the output stage during integration. The output stage includes a conventional operational amplifier 208 and integration capacitors 209a and 209b.

Output DAC 200 operates generally as follows. Switches 205 close at the start of the sampling phase (Phase 1–$\phi_1$), and after a delay (Phase 1 delayed–$\phi_{1D}$), input switches 202 close to sample the input bits D0–Dn and the complements /D0–/Dn onto the input plates of sampling capacitors 204. Switches 203 and 206 are open during Phase 1. During the integration phase (Phase 2–$\phi_2$), switches 206 initially close, and after a delay (Phase 2 delayed–$\phi_{2D}$), switches 203 close to force the charge on the input plates of sampling capacitors 204 to the corresponding summing node of opamp 208 and integration capacitor 209a or 209b. During Phase 2, switches 202 and 205 are open.

In the ideal case, unit conversion elements 201 would provide charge in equal unit steps to the integrator summing nodes during the integration phase. However, in actual devices, mismatch between the values of the multiple capacitors 204 will result in variations in the charge steps generated by conversion element 201. A one-percent (1%) mismatch between elements 204 approximately increases the overall noise floor to −40 dB relative to the noise floor of a single output. This noise then dominants the system. Hence, DEM circuitry is typically utilized which routes bits D0–Dn and complementary bits /D0–/Dn to different combinations of conversion elements 201 such that the utilization of each conversion elements is approximately equalized. While this routing spreads the mismatch noise across the output signal band, DEM techniques also produce tonality in the output noise, depending on the DEM algorithm utilized. The DEM circuitry also adds size and complexity to the design.

Mismatch error must also be addressed in feedback DACs, such as feedback DAC 108 of ADC 100 shown in FIG. 1A. FIGS. 3A and 3B illustrate representative switched-capacitor analog integrator stage/summer 300 with multiple-bit DAC feedback from quantizers 106 suitable for use as feedback DAC 108 of FIG. 1A. As with output DAC 200, an exemplary two-phase switch-capacitor design will be described.

For the differential input data paths sampling input signals $V_{in+}$ and $V_{in-}$ switches 304a and 304b close during sampling Phase 1 ($\phi_1$) to couple the top plates of input sampling capacitors ($C_{IN}$) 303a and 303b to the common mode voltage ($V_{cm}$). During Delayed Phase 1 ($\phi_{1D}$), switches 301a and 301b close and the differential input voltage $V_{IN}$ is sampled onto input plates of sampling capacitors ($C_{IN}$) 303a and 303b. Switches 302a–302b and 305a–305b are open during sampling ($\phi_1$).

Also, during the sampling phase ($\phi_1$), the reference voltage $V_{REF}$ ($V_{REF+}-V_{REF-}$) is sampled through feedback DAC 300. Two representative unit DAC elements 320 of an exemplary DAC operating on n+1 number of bits in response to digital bits D0–Dn and the complementary bits /D0–/Dn from quantizers 106 of FIG. 1A are shown in further detail FIG. 3B. In particular, $V_{REF}$ is sampled onto reference sampling capacitors ($C_{REF}$) 306a and 306b for each bit path 320 by switches 307a and 307b and 304a and 304b (as shown in FIG. 3A). Switches 309a and 309b (FIG. 3A) are open during the sampling phase.

Switches 310a–310d for each path (as shown in FIG. 3B), under the control of complementary bits D0–Dn and /D0–/Dn from the associated quantizer 106, couple or cross-couple the input plates of reference sampling capacitors $C_{REF}$ 306a and 306b to the reference voltage $V_{REF}$ being sampled by reference sampling switches 307a and 307b. In other words, the configuration of switches 310a–310d for a given reference sampling path 320 sets the polarity of the voltage at the input plates of the corresponding reference sampling capacitors 306a and 306b as a function of quantizer feedback.

During the integration phase ($\phi_2$) the switches reverse their configuration with switches 302a and 302b closing, and switches 301a–301b and 304a–304b opening for the input signal paths. For the reference paths, switches 307a and 307b open and switches 309a and 309b close. The charges on the input plates of input sampling capacitors $C_{IN}$, and reference sampling $C_{REF}$ are forced to the output (top) plates and charge sharing nodes A and B. During Delayed Phase 2 ($\phi_{2D}$) switches 305a and 305b close to transfer the charge at nodes A and B from the top plates of input and reference sampling capacitors $C_{IN}$ and $C_{REF}$ to the summing nodes at the inverting (–) and non-inverting (+) inputs of opamp 312 and integrator capacitors ($C_1$) 311a and 311b.

With respect to feedback DAC—summer—integrator stage 300, mismatch between elements (bit paths) 320 results in non-linearities in the charge contributions at nodes A and B. DEM circuitry is therefore typically included in the feedback (DAC) path to equalize element utilization. The case of a feedback DAC, the DEM circuitry is normally and significantly large, especially in the case of a high-voltage ADC.

Generally, modulators 103 and 114 respectively of FIGS. 1A and 1B are designed by trading off between global (overall) noise shaping and local noise shaping to account for DAC element mismatch. Specifically, global filter stages 104 and 115 in conjunction with the local filter stages 105 or 116 set the overall noise shaping characteristics of the given modulator 103/114 while local filter stages 105 or 116 set the local noise shaping characteristics for corresponding sets of DAC elements. The resulting system shapes the overall noise (of the sum of the elements) to a greater extent than the noise at each quantizer output. This operational characteristic is similar to the function provided in two stages by a DEM. Consequently, the conventional DEM circuitry is eliminated, or at least made significantly simpler and smaller. As an example, the quantizers may be all single bit, removing the need for any DEM circuitry. Alternatively, the quantizers could be three-level with simple two-element DEMs per quantizer.

Figure 4A:
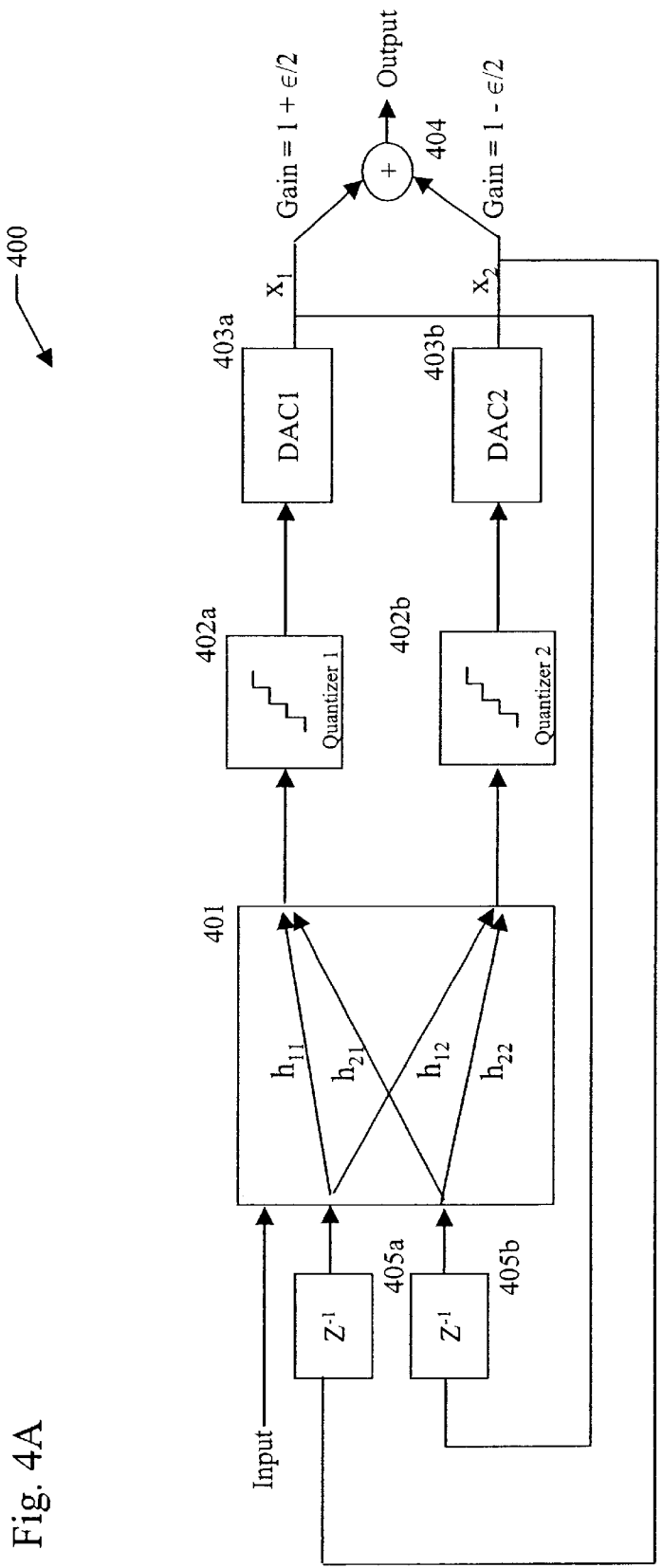
FIGS. 4A and 4B are conceptual diagrams of a delta-sigma DAC with multiple quantizers, a shared filter for overall noise shaping and independent filters for mismatch noise shaping according to the inventive principles.
Figure 4B:
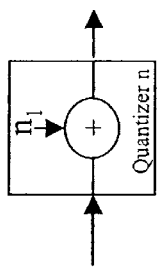

FIG. 4A is a conceptual (general) representation of a delta-sigma DAC topology 400 with shared and independent filters and multiple quantizers. DAC topology 400 includes a loop filter system 401, two quantizers 402a–402b, two DACs 403a–403b and an output summer 404. Quantizers 402a and 402b are shown as multiple-bit quantizers and are modeled as additive quantization noise sources, as generally shown in FIG. 4B. Two feedback loops 405a and 405b, which include delays for timing, couple the outputs $X_1$ and $X_2$ of DAC1 403a and DAC2 403b back to the inputs of loop filter system 401. While a two quantizer—two feedback loop DAC topology 400 is shown in FIG. 4A for illustrative purposes, the concepts described with respects to modulator 400 may be extended to any modulator topology with n number of multiple quantizers and n number of corresponding feedback loops, n being an integer greater than one. The general concepts and principles taught by the shared and independent filters 402a and 402b of loop filter system 401 and multiple quantizers result in the ability to provide global and local noise shaping for various modulator topologies, such as illustrated in exemplary modulator topologies 500, 600, 700, 800 and 900 discussed below.

For the representative two quantizer—two feedback loop embodiment, loop filter system implements four transfer functions (respectively $h_{11}$, $h_{12}$, $h_{21}$, $h_{22}$) between the outputs of the two feedback loops 405a–405b and the inputs to the two quantizers 402a–402b. Transfer functions $h_{11}$, $h_{12}$, $h_{21}$, $h_{22}$ are all non-zero functions, and at least two transfer functions $h_{11}$, $h_{12}$, $h_{21}$, $h_{22}$ are different. For purposes of describing application of the inventive principles, $h_{11}=h_{22}$ and $h_{12}=h_{21}$. However, these relationships are not a strict requirement for practicing the inventive principles.

With $h_{11}=h_{22}$ and $h_{12}=h_{21}$, the noise at the output of summer 404 (Output) is:

$$\frac{n_1+n_2}{1+(z^{-1}-1)(h_{11}+h_{12})} + \in \cdot \frac{n_1-n_2}{1+(z^{-1}-1)(h_{11}-h_{12})} \quad (1)$$

in which $n_1$ and $n_2$ are the quantization noise from quantizers 402a and 402b and $\in$ is the mismatch between the outputs of DACs 403a and 403b into output summer 404. Therefore, the sum of the transfer functions ($h_{11}+h_{12}$) sets the global noise shaping and the difference of the transfer functions ($h_{11}-h_{12}$) sets the local noise shaping of the mismatch $\in$.

Global noise shaping is the ability of delta-sigma modulator topology 400 to shape the total noise spectrum (i.e. $n_1+n_2$) output from quantizers 402a and 402b and summed by summer 404. In other words, the global noise shaping function characterizes the noise transfer function (NTF) of the total output noise, including noise attenuation in the signal band and out-of-band noise gain. Local noise shaping is the ability of delta-sigma modulator topology 400 to shape the difference in the noise spectrums output from quantizers 402a and 402b into summer 404 (i.e. $n_1-n_2$). By shaping the difference in noise spectrums $n_1$ and $n_2$, the noise demodulated by any mismatch from the outputs of DACs 403a and 403b into summer 404 is also shaped.

By selecting the transfer functions $h_{11}$ and $h_{12}$, and consequently transfer functions $h_{22}$ and $h_{21}$, a design tradeoff is made between the global noise shaping defined by the first term of Equation 1 and the local noise shaping defined by the second term of Equation 1. Specifically, the total quantization noise $(n_1+n_2)$ gain is proportional to $h_{11}+h_{12}$ and the gain of the quantization noise difference $(n_1-n_2)$ exposed to the mismatch $\in$ is proportional to $h_{11}-h_{12}$. Therefore, to decrease the exposure to the mismatch, the term $h_{11}-h_{12}$, which shapes the difference $n_1-n_2$ between noise spectrums, is made smaller, for example by reducing the contribution of transfer functions $h_{12}$ and $h_{21}$. However, if the contribution of transfer functions $h_{12}$ and $h_{21}$ are reduced, the global noise shaping in the passband is also reduced in accordance with the first term of Equation 1. Similarly, an improvement in global noise shaping by increasing the sum of the transfer functions (i.e., $h_{11}+h_{12}$) will generally reduce the local noise shaping capability by the difference of the transfer functions (i.e., $h_{11}+h_{12}$).

Figure 5:
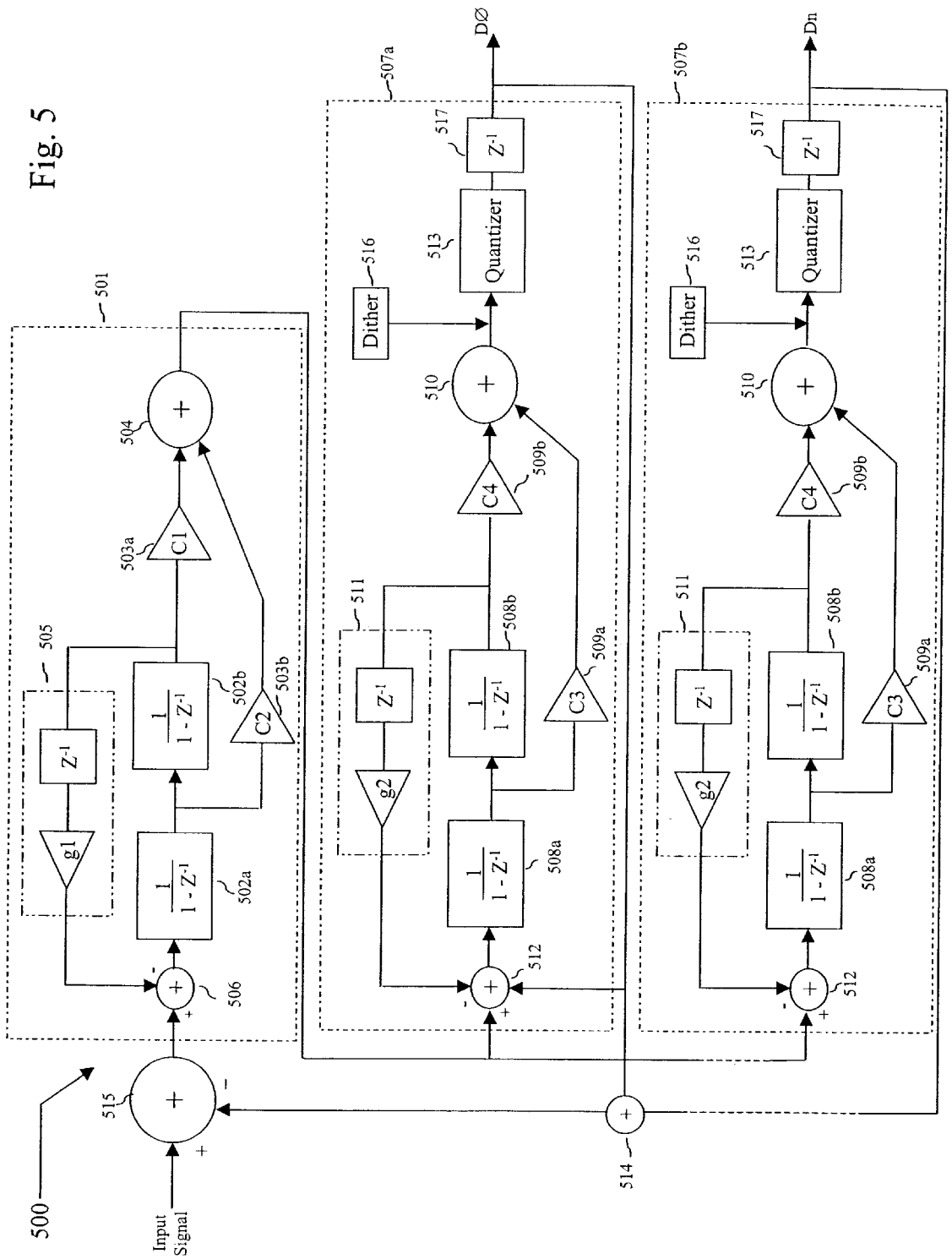
FIG. 5 is a block diagram of an exemplary feed-forward delta-sigma modulator topology utilizing shared and independent sets of filter stages and multiple quantizers according to the present principles.

FIG. 5 is a block diagram of a representative mixed feed-forward/feed-back delta-sigma modulator topology 500 utilizing global and local sets of filter stages and multiple quantizers. Modulator topology 500 may be implemented in the analog domain, for use in modulator 103 of ADC system 100 or in the digital domain for use in modulator 114 of DAC system 111.

In modulator topology 500, the global noise shaping circuitry (filter) is shown generally by the shared modulator circuitry 501. In this example, two integrator stages 502a and 502b are shown for illustration. However, as with each of the modulator topologies described herein, the number and type of shared filter stages may vary depending on the desired noise global shaping (e.g. the number and frequencies of the poles and zeros of the noise transfer function). The outputs from filter stages 502a and 502b are fed-forward with weighting coefficients C1 and C2 through feed-forward paths 503a and 503b into output summer 504. Feed-forward paths 503a and 503b include analog attenuators or gain stages for analog embodiments or multipliers in digital embodiments which apply the weighting coefficient C1 and C2. A feedback path 505, with gain g1 and delay $z^{-1}$ and input summer 506 move the zeros of the noise transfer function ("NTF") defined by filter stages 502a and 502b along the unit circle in the z-plane.

The output from shared filter 501 is passed to each of n+1 number of parallel independent feed-forward noise shaping circuits (filters) drive outputs D0–Dn. Two exemplary independent noise shaping circuits 507a and 507b are shown generally in FIG. 5 for illustrative purposes. In this example, independent feed-forward noise shapers 507a and 507b are based on two filter (integrator) stages 508a and 508b and corresponding feed-forward paths 509a and 509b weighting the integrator outputs by coefficients C3 and C4 into an output summer 510. As with each of the modulator topologies described herein, the number and type of filter stages used in the independent filter sections of the given loop filter will vary depending on the desired local noise shaping response. A feedback path 511 with gain g2 and delay $z^{-1}$ and input summer 512 set the zeros of local noise transfer function.

Each independent noise shaper 507a and 507b includes an independent quantizer 513, which may be either a single-bit or a multiple-bit design. If a single-bit design is used, optional DEM circuits 107a and 107b or 120a and 120b (see respective FIGS. 1A and 1B) may be eliminated from the converter. If a multiple-bit design is used, then some minimal optional DEM circuits 107/120 are included in respective systems 100 and 111 (see respective FIGS. 1A and 1B) to noise shape any remaining mismatch noise.

The quantized output from each local quantizer 513 is fed-back to the corresponding local input summer 512 to close the independent feedback loop. The quantized outputs of all independent quantizers 513 are summed in summer 514 and then fed-back to the inverting input of input summer 515 to close the overall modulator feedback loop.

A dither source 516 is provided at the input of each local quantizer 516 to reduce or eliminate tonality in the modulator outputs D0–Dn. Preferably, the amount of dither input into each quantizer 513 is selected such that the sum of the dither at the modulator outputs from all quantizers 513 is a constant. Consequently, tonality is avoided in the output without substantially increasing the overall noise floor. This result is accomplished by using a pseudo-random number generator (PRN) which generates bits that increase the quantized level at some outputs and decrease the quantized level at other outputs. An exemplary dither generation source is discussed below in conjunction with FIG. 10.

The overall modulator loop including the shared global noise shaping circuitry 501, modulator input summer 515 and the parallel independent noise shapers 507 sets the overall noise shaping of the modulator output. Each independent noise shaper 507 individually shapes the noise to its corresponding output. However, a tradeoff generally must be made since more feedback in each independent noise shaper 507 improves the local mismatch shaping but worsen the overall noise shaping characteristics of the modulator. Loop timing is ensured by delays 517.

Figure 6:
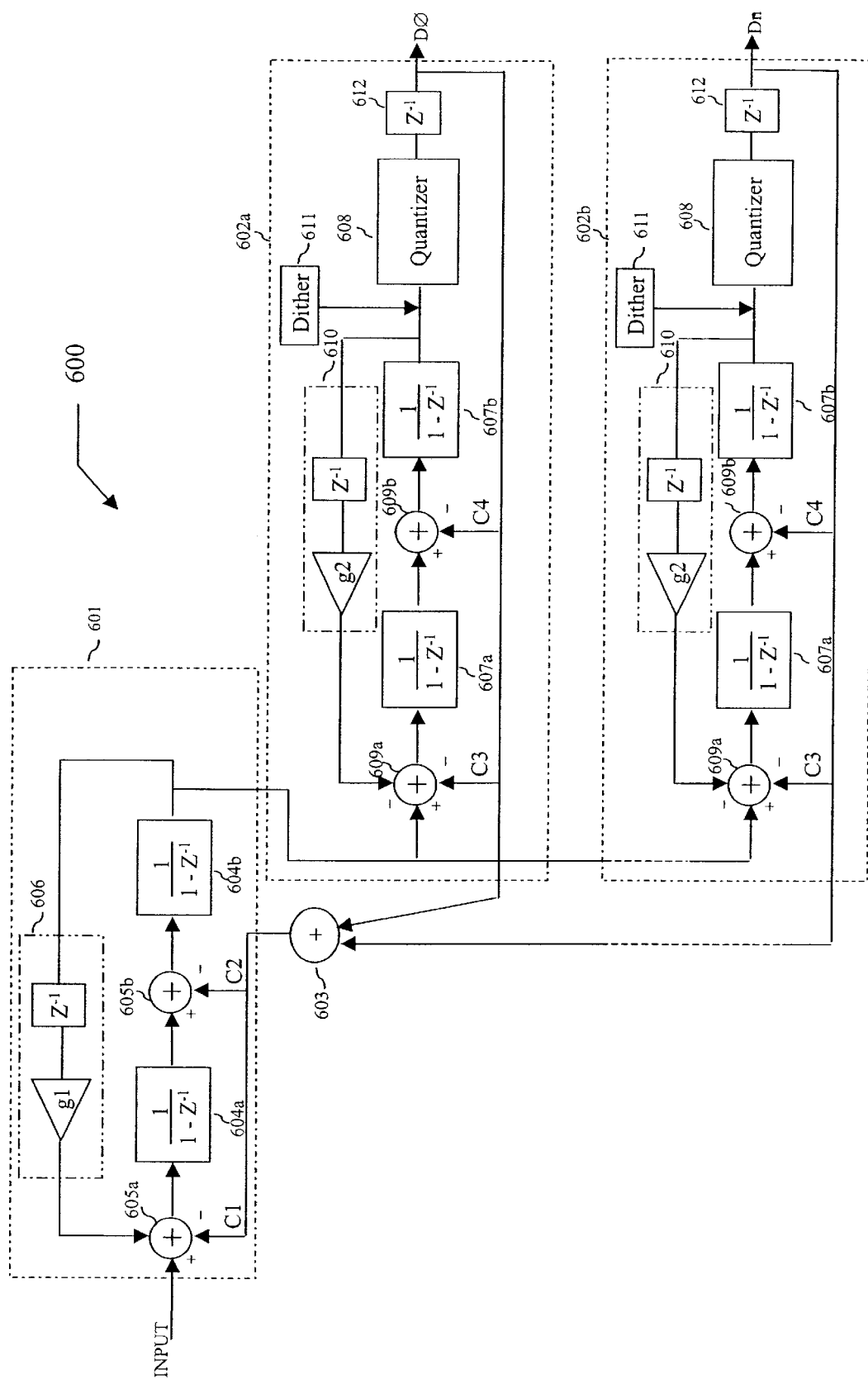
FIG. 6 illustrates an exemplary feedback modulator topology with both shared and independent filters and multiple quantizers according to the inventive principles.

FIG. 6 illustrates an exemplary feedback modulator topology 600 with both shared and independent filters and multiple quantizers according to the inventive principles. In this case, shared filter 601 provides the modulator front-end, and a set of n+1 number of independent filters 602a and 602b drive the outputs D0–Dn, in which n is an integer of one or greater. Two representative independent filters 602a and 602b are shown in FIG. 6 for discussion purposes. The sum of all the quantized outputs from independent filters 602 is generated by summer 603 and is fed-back to shared filter 602 to control the overall noise shaping characteristics of the modulator. As will be discussed further below, each independent filters 602a and 602b has its own independent feedback loop for setting the local noise shaping characteristics of the associated output D0–Dn.

For illustrative purposes, shared filter 601 is shown as a two-stage feedback noise shaper including a pair of filter stages 604a and 604b. The number of shared filter stages 604a and 604b, as well as their transfer functions, may vary from application to application depending on the desired NTF. In this example, two integrator stages 604a and 604b are shown.

The feedback summed by summer 603 is weighted into summers 605a and 605b of shared filter 601 with feedback coefficients C1 and C2. Coefficients C1 and C2 set two poles in the overall NTF at each modulator output. The associated NTF zeros are set on the unit circle in the z-plane by local feedback loop (resonator) 606 having a gain g2 and a delay $z^{-1}$.

Each independent filter 602a and 602b, in conjunction with shared filter 601 operates as a separate noise shaper. In FIG. 6, each independent filter (noise shaper) 602a–602b is based on a pair of filter stages 607a and 607b. For illustration purposes, filter stages 607a–607b are shown as integrator stages, although the number of filter stages 607 as well as their transfer functions, may vary in alternate embodiments.

Each independent filters 602a–602b includes a dedicated quantizer 608 and a local feedback loop implemented with summers 609a and 609b. Coefficients C3 and C4 set two more poles of the NTF for the corresponding output D0–Dn. A local feedback loop (resonator) 610, with gain g2 and delay $z^{-1}$, sets two more zeros of the NTF. Quantizer 608 is either of a single-bit or a multiple-bit design. If the multiple-bit design is selected, optional DEM 107a and 107b or 120a and 120b (see respective FIGS. 1A and 1B) is preferably utilized in system 100/111 to address any mismatch. Dither sources 611, as discussed further below with respects to FIG. 10, at the input to each quantizer 608 reduce or eliminate the tonality of the quantizer outputs. Similar to dither sources 516, if the sum of the dither added to modulator 600 is a constant, the overall noise floor will not substantially increase. Each feedback loop also includes a delay 612 at the quantizer 608 output.

Figure 7:
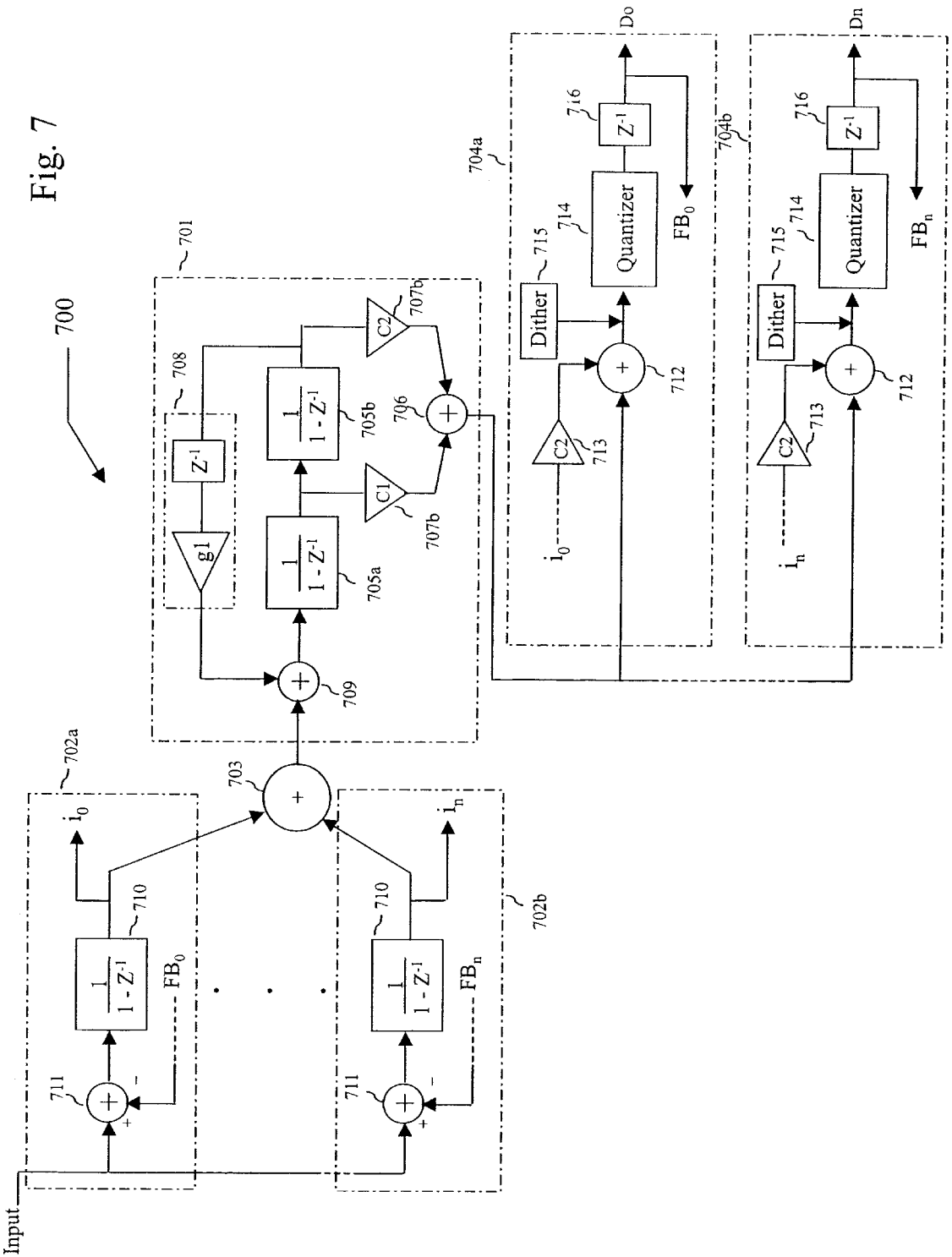
FIG. 7 depicts an exemplary delta sigma modulator topology with shared and independent filter stages and multiple quantizers, in which the shared filter is fed by the independent filters.

The shared filter section according to the present principles is alternatively disposed between the independent filters and the multiple quantizers, as demonstrated by exemplary delta-sigma modulator topology 700 shown in FIG. 7. Delta-sigma modulator topology 700 includes a shared filter section 701, which has an the input driven by the sum of the feed-forward contributions of n+1 number of independent filters 702 generated by summer 703, in which n is an integer of one or greater. Two representative independent filters 702a and 702b are shown in FIG. 7. The output from shared filter 701 drives n+1 number of output stages, two of which are shown at 704a and 704b for illustrative purposes. Output stages 704a and 704b receive the weighed feedforward output ($i_0$ and $i_n$) from independent filters 702a and 702b, respectively. In turn, the quantized output from output stages 704a and 704b ($FB_0$ and $FB_n$) is fed-back to the input of independent filters 702a and 702b, respectively.

In this example, shared filter section 701 is based on a pair of integrator stages 705a and 705b having outputs fed-forward into a summer 706 through weighting stages 707a–707b (which include amplifiers, multipliers or attenuators) with weighting coefficients C1 and C2. Filter section 701 sets two pole-zero pairs in the global NTF. Filter 701 section is also shown with a feedback loop 708, with gain g1 and delay and input summer 709 for moving the global zeros along the unit circle of the z-plane.

Independent filters 702a–702b are represented by an integrator stage 710 and an input summer 711 summing the input signal with feedback $FB_0$–$FB_n$ from the output stages 704a and 704b. The number of stages in independent filters 702a and 702b and their transfer functions may vary depending on the application.

Output stages 704a–704b each include a summer 712, weighting stage 713 having a weighting coefficient C2 for weighting the signal fed-forward from the corresponding input filters 702a and 702b. A single- or multiple-bit quantizer 714 through a delay 716 generates the output D0–Dn. A dither source 715, similar to those already described and shown in FIG. 10, reduces or eliminate tonality at the corresponding output D0–Dn.

Figure 8:
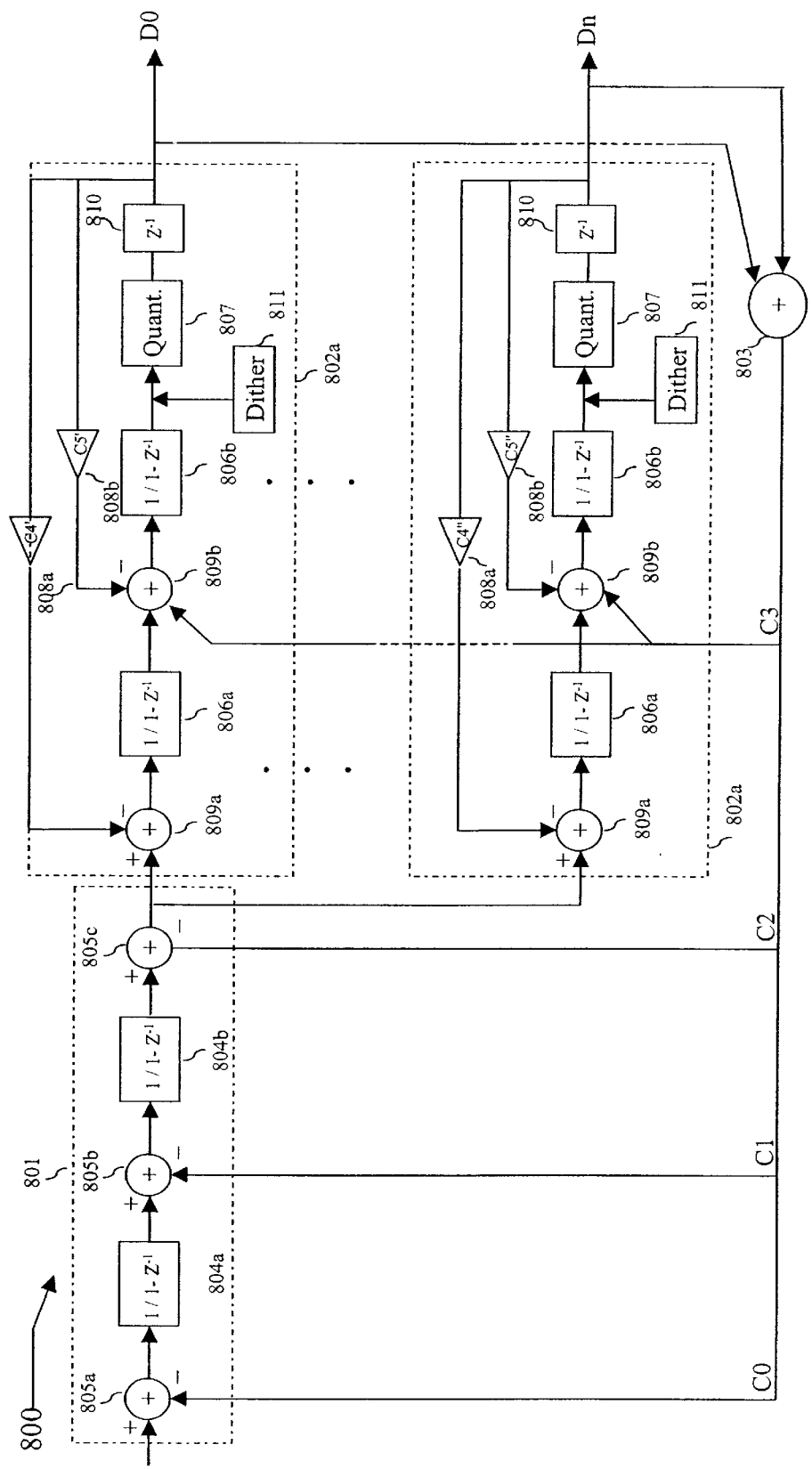
FIG. 8 illustrates a further exemplary feedback delta sigma modulator topology with shared and independent filters and multiple quantizers embodying the principles of the present invention.

A further exemplary delta-sigma modulator topology 800 embodying the principles of the present invention is shown in FIG. 8. Modulator topology 800 includes a shared filter 801, n+1 number of independent filters represented by exemplary independent filters 802a–802b, and a summer 803 summing the outputs from the independent filters 802a and 802b. The feedback sum generated by modulator summer 803 is fed-back to both shared filter 801 and each representative independent filter 802a and 802b. Independent filters 802a–802b also have local feedback loops that will be discussed further below.

In modulator topology 800, shared filter 801 includes a pair of integrator stages 804a and 804b and feedback summers 805a–805c for weighed feedback of the sum from modulator summer 803 with feed-back coefficients C1–C3. The pair of integer stages 804a and 804b and feedback coefficients set two pole-zero pairs in the global NTF.

Independent filters 802a–802b in modulator topology 800 include a pair of integrator stages 806a–806b and a dedicated quantizer 807 (multiple-bit or single-bit). A delay 810 is provided at the quantizer output to ensure proper signal timing. Each independent filter 802a–802b also includes a pair of feedback paths 808a and 808b and summers 809a and 809b. Independent feedback paths 808a and 808b apply local feedback coefficients C4 and C5 which control the local noise shaping response. Summers 809b also receive the sum of the feedback from summer 803, weighted by feedback coefficient C3. Delays 810 ensure the proper timing and dither sources 811 (see FIG. 10) reduces or eliminate tonality in the output.

Figure 9:
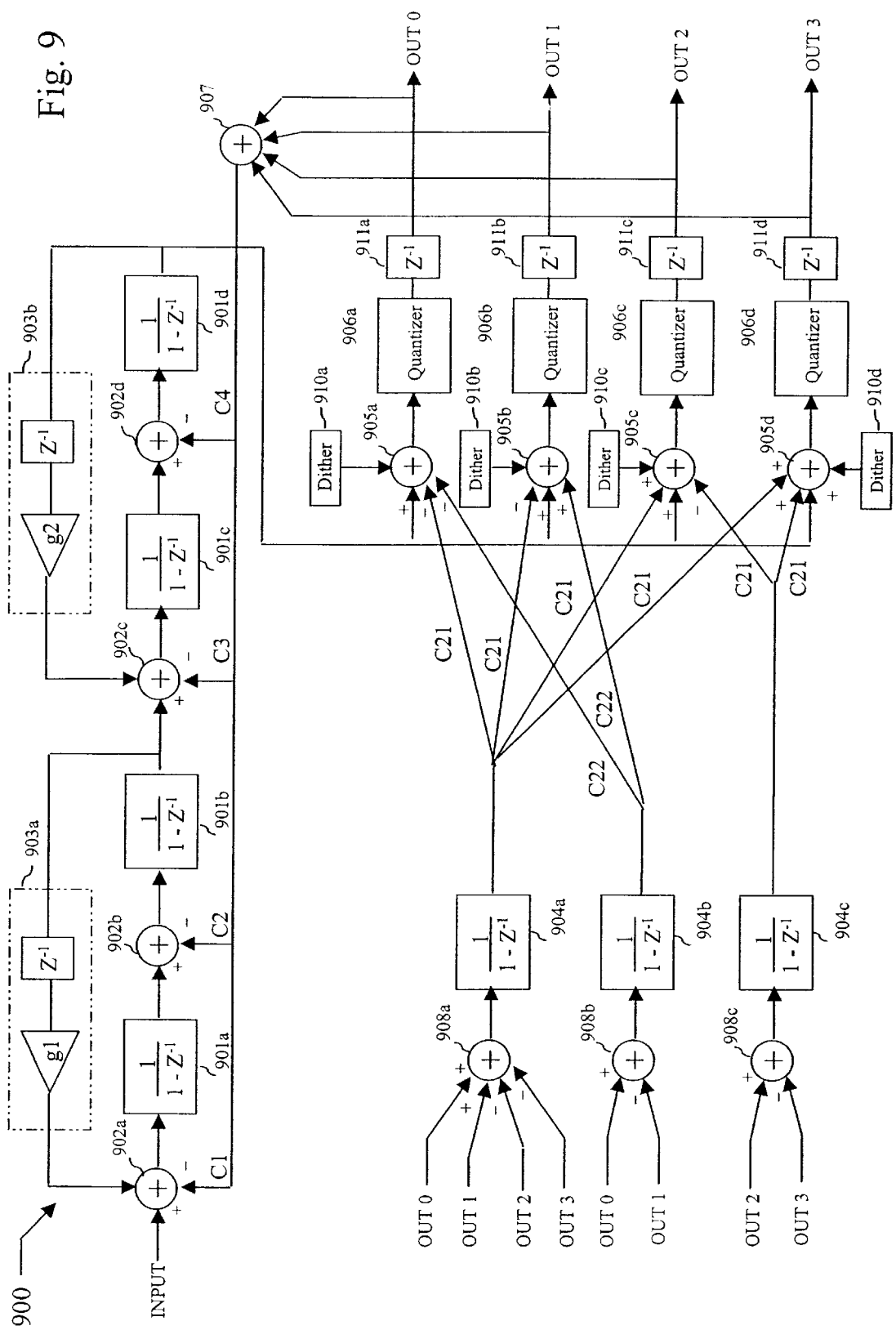
FIG. 9 illustrates an exemplary delta sigma modulator topology with multiple quantizers which includes a shared filter and multiple independent filters for noise shaping the difference between four (4) output signals.

Noise shaper topology 900 shown in FIG. 9 integrates the DEM function into the modulator itself. In the illustrated embodiment, noise shaper 900 utilizes four shared integrator stages 901a–901d and corresponding summers 902a–902d in a feedback topology with feedback coefficients C1–C4. A pair of feedback loops (resonators) 903a and 903b having respective gains of g1 and g2 and delays $z^{-1}$ set the shared zeros.

The independent filters in exemplary noise shaper 900 are represented by single integrator stages 904a–904c. The number of shared filter stages 901 and independent filter stages 904, as well as their transfer functions, vary from embodiment to embodiment depending on the desired noise shaping characteristics.

The outputs from independent filter stages 904a–904c are fed-forward with weighting coefficients C21 and C22 into summers 905a–905d. Summers 905a–905d, which also receive the output from final shared filter stage 901b, drive corresponding multiple quantizers 906a–906d. The quantized outputs OUT 0–OUT 3 from respective quantizers 906a–906d are passed through corresponding delays 911a–911d and then summed by summer 907 to generate the feedback to shared filter stages 901a–901d. Additionally, the quantized outputs are also fed-back to summers 908a–908c at the inputs to respective independent filter stages 904a–904b.

In this example, independent feedback summer 908a takes the difference between the sum of OUT 0 and OUT 1 and the sum of OUT 2 and OUT 3. Independent feedback summer 908b takes the difference between OUT 0 and OUT 1 and feedback summer 908c takes the difference between OUT 2 and OUT 3. After filtering by independent filter stages 904a–904c, summers 905a and 905b take the following weighted combinations. Summer 905a takes the difference between the output of shared filter 901d, the output of independent filter 904a, and the output of independent filter 904b. Summer 905b subtracts the output of independent filter 904a from, and adds the output of independent filter 904b to, the output of shared filter 901d. Summer 905c subtracts the output of independent filter 904c from, and adds the output of independent filter 904a to, the output of shared filter 901d. Finally, summer 905d takes the sum of the output of shared filter 901d; the output of independent filter 904a and the output of independent filter 904c. Four dither sources 910a–910d are summed into the 4 quantizers to help eliminate patterns; the total dither applied always sums to a constant. In a typical delta-sigma modulator, this dithering would increase the noise floor. In this topology, it is possible to increase the noise less by having the dither sources sum to a constant.

Figure 10:
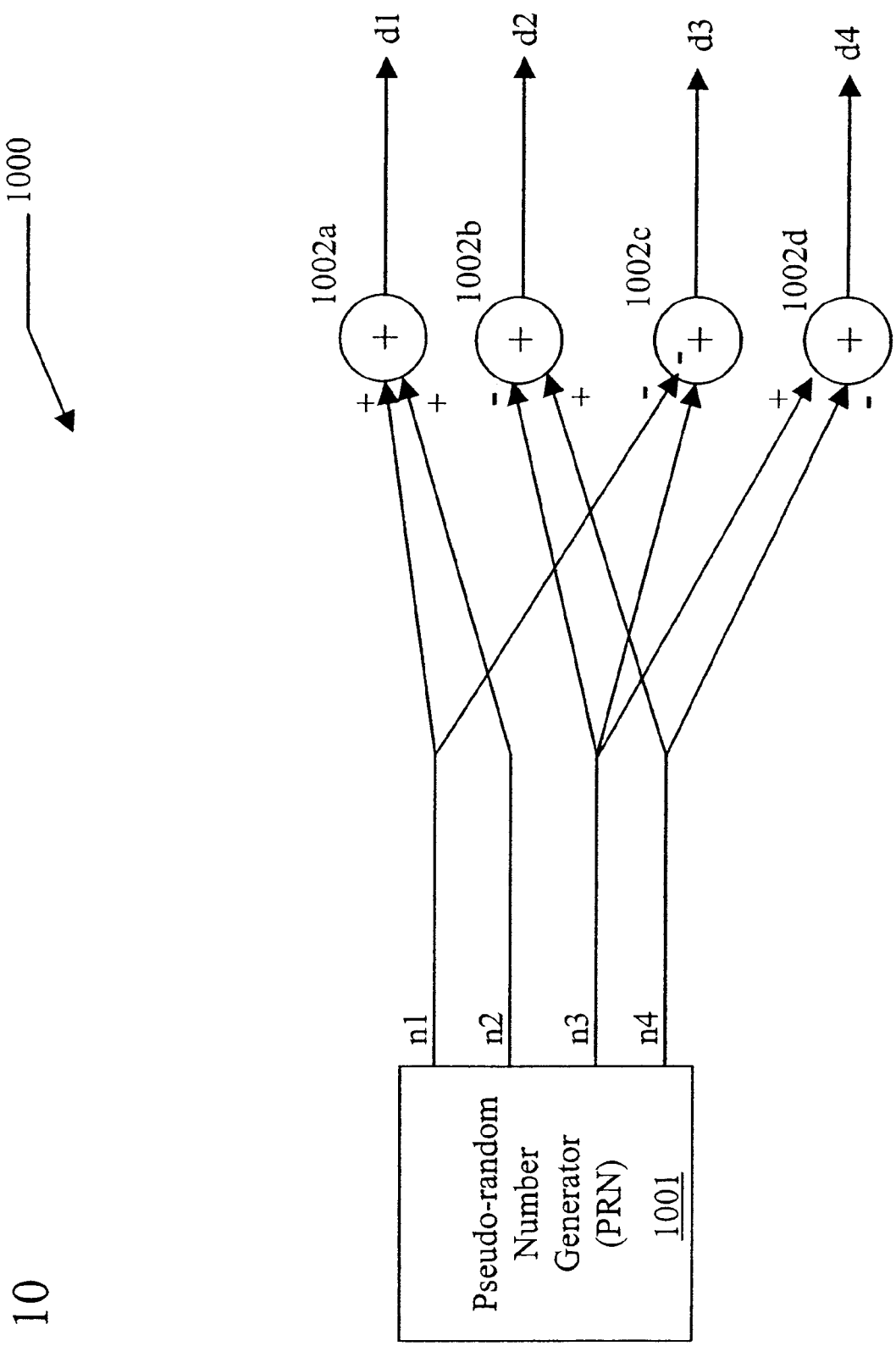
FIG. 10 is a schematic representation of an exemplary dither source (generator) suitable for introducing dither adding up to a constant to the quantizer inputs of the delta sigma modulators of FIGS. 4–9.

FIG. 10 is a schematic representation of an exemplary dither source (generator) 1000 suitable for generating dither streams which add to a constant. Dither generator includes a pseudo-random number generator (PRN) 1001 and a set of summers 1002a–1002d for a four-bit system. In this example, the pseudo-random number streams n1–n4 and the complements are summed in the following manner to generate dither streams d1–d4:

$$d1=n1+n2$$
$$d2=n4-n2$$
$$d3=-n1+n3$$
$$d4=-n4-n3$$

In this example, dither d1+d2+d3+d4 sum to a constant of zero (0). This implementation would be especially appropriate to D/A converters, as the filters 904a, b, c, are very simple having only integer inputs and may be implemented with very few bits of memory.

In each of the topology described above, appropriate selection of the individual shared and independent filter stages result in a very efficient design. Generally, since the earlier stages in the loop filter require more accuracy, the earlier stages are made larger and with increased fabrication accuracy. In turn, the later filter stages in the loop are made smaller and with less fabrication accuracy. Moreover, if the unique stages in the loop filter are placed later in the loop, those unique stages are less accurate without adversely impacting the overall modulator performance.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A noise shaper comprising:
   first and second quantizers;
   first and second feedback paths each providing feedback from a corresponding quantizer output; and
   a loop filter system implementing a plurality of functions including a first non-zero transfer function between the first feedback path and an input the first quantizer, a second non-zero transfer function between the first feedback path and an input of the second quantizer, a third non-zero transfer function between the second feedback path and the input of the first quantizer and a fourth non-zero transfer function between the second feedback path and the input the second quantizer.

2. The noise shaper of claim 1 wherein the first transfer function is approximately equivalent to the fourth transfer function and the second transfer function is approximately equivalent to the third transfer function.

3. The noise shaper of claim 1 wherein the plurality of quantizers comprises n number of quantizers, the plurality of feedback loops comprises n number of feedback loops and the loop filter system implements $n^2$ number of transfer functions between outputs of each of the n number of feedback loops and inputs of the n number of quantizers.

4. A noise shaper comprising:
   a loop filter including a shared filter and first and second independent filters;
   a first quantizer for generating a first quantized output signal from a first output of the loop filter, the first quantized output signal fed-back to the first independent filter; and
   a second quantizer for generating a second quantized output signal from a second output of the loop filter, the second quantized output signal fed-back to the second independent filter.

5. The noise shaper of claim 4 further comprising a feedback loop for feeding-back a sum of the first and second quantized output signals to the shared filter.

6. The noise shaper of claim 4 wherein an output signal from the shared filter drives inputs of the first and second independent filters.

7. The noise shaper of claim 4 wherein output signals from the first and second independent filters drive an input of the shared filter.

8. The noise shaper of claim 4 further comprising dither generation circuitry for generating dither at inputs of the first and second quantizers.

9. The noise shaper of claim 8 wherein the dither at the inputs of the first and second quantizers are non-equal and sum to a constant at corresponding first and second outputs of the modulator.

10. The noise shaper of claim 4 wherein at least one of the shared and independent filters has a feedforward topology.

11. The noise shaper of claim 4 wherein at least one of the shared and independent filters has a feedback topology.

12. The noise shaper of claim 4 wherein a selected one of the quantizers comprises a single-bit quantizer.

13. The noise shaper of claim 4 wherein a selected one of the quantizers comprises a multiple-bit quantizer.

14. A delta-sigma modulator comprising:
   a plurality of quantizers for generating a plurality of quantized output signals in response to outputs from a loop filter; and
   a loop filter driving inputs of the plurality of quantizers, the loop filter including at least one shared filter stage receiving a sum of feedback from each of the plurality of quantizers for characterizing a global modulator noise transfer function of the quantized output signals and a plurality of independent filter stages each receiving feedback from a corresponding one of the quantizers for characterizing a local noise transfer function of a corresponding one of the quantized output signals.

15. The delta-sigma modulator of claim 14 wherein the shared filter receives a modulator input signal and drives inputs to the plurality of independent filter stages.

16. The delta-sigma modulator of claim 14 wherein at least one of the plurality of independent filters receives a modulator input signal and drives an input to the shared filter.

17. The delta-sigma modulator of claim 14 further comprising a dither source for providing dither at an input of each of the plurality of quantizers.

18. The delta-sigma modulator of claim 14 wherein the dither provided to the inputs of the plurality of quantizers sums to a constant value.

19. The delta-sigma modulator of claim 14 wherein the plurality of independent filters receive a modulator input signal and drive an input of the shared filter and an output of the shared filter drives inputs of the plurality of quantizers.

20. The delta-sigma modulator of claim 19 wherein the plurality of independent filters each feed-forward a feedforward signal to the input of a corresponding one of the quantizers.

21. The delta-sigma modulator of claim 14 wherein at least one of independent filters receives a feedback signal from a sum of the quantized output signals.

22. A method of noise shaping comprising:
characterizing local noise shaping of each of first and second signals with corresponding first and second independent filter sets each having at least one filter stage;
characterizing global noise shaping of the first and second signals with a shared filter set having at least one filter stage shared by the first and second sets of independent filter stages; and
independently quantizing the first and second signals with first and second quantizers.

23. The method of claim 22 further comprising:
feeding-back a first quantized signal from the first quantizer to the first independent filter set;
feeding-back a second quantized signal from the second quantizer to the second independent filter set; and
feeding-back a sum of the first and second quantized signals to the shared filter set.

24. The method of claim 22 further comprising applying dither at inputs of the first and second quantizers to reduce tonality in the first and second quantized output signals.

25. The method of claim 24 wherein said step of applying dither at the inputs of the first and second quantizers further comprises selectively applying dither at the inputs of the first and second quantizers which sum to a constant.

26. The method of claim 22 further comprising driving inputs of the independent filter sets with an output of the shared filter set.

27. The method of claim 22 further comprising driving an input of the shared filter set with an output of at least one of the independent filter sets.

28. A data conversion system for converting data from a first form to a second form comprising:
a delta-sigma modulator for modulating an input signal comprising:
a loop filter including a shared filter stage and a plurality of independent filter stages each sharing a signal path with the shared filter stage; and
a plurality of quantizers for generating independently quantized output signals from outputs of the loop filter, an output of each quantizer fed-back to a corresponding one of the independent filter stages; and
a digital to analog converter for converting the quantized outputs from the plurality of quantizers into analog.

29. The data conversion system of claim 28 wherein a sum of the quantized outputs from the plurality of quantizers is fed-back to the shared filter stage.

30. The data conversion system of claim 28 wherein the system converts data from digital to analog form and the digital to analog converter comprises a output digital to analog converter.

31. The data conversion system of claim 28 wherein the system converts data from analog to digital form and the digital to analog converter comprises a feedback digital to analog converter.

32. The data conversion system of claim 28 and wherein the plurality of quantizers comprise single-bit quantizers.

33. The data conversion system of claim 28 wherein the plurality of quantizers comprise multiple-bit quantizers and the system further comprises dynamic element matching circuitry between outputs of the plurality of multiple-bit quantizers and the digital to analog converter.

34. A data conversion system comprising a delta-sigma modulator with multiple quantizers and multiple dither noise sources, wherein the sum of the dither noise sources has significantly less power than the sum of the powers of the noise sources.

35. The data conversion system of claim 34 wherein the sum of the dither noise sources is approximately zero.

36. A method of noise shaping comprising:
filtering an input signal with a shared filter contributing to the inputs of each of a plurality of quantizers, a sum of outputs from the quantizers fed-back to an input of the shared filter to globally noise shape a sum of the spectrums of the outputs of the quantizers; and
filtering a difference between the outputs of the quantizers with a local filter system, the filtered difference fed-back to inputs of each quantizer to locally noise shape a difference of the spectrums of the outputs of the quantizers.

37. The method of claim 36 wherein filtering the difference comprises:
taking a difference between outputs of first and second quantizers; and
filtering the difference with a local filter system comprising a shared local filter.

38. The method of claim 36 wherein filtering the difference comprises:
filtering an output of the shared filter with a local filter system comprising a plurality of parallel filters, each parallel filter receiving feedback from a corresponding one of the quantizers.

39. The method of claim 36 wherein filtering the difference comprises filtering the spectrum of the difference of the output of the quantizers to shape mismatch noise in a set of conversion elements.

* * * * *

UNITED STATES PATENT AND TRADEMARK OFFICE
CERTIFICATE OF CORRECTION

PATENT NO. : 6,744,392 B2
DATED : June 1, 2004
INVENTOR(S) : John Laurence Melanson It is certified that error appears in the above-identified patent and that said Letters Patent is hereby corrected as shown below:

<u>Column 5,</u>
Line 18, there should be a space after the "+" sign and the subscript "1" should be a comma.

Signed and Sealed this

Twenty-third Day of November, 2004

JON W. DUDAS
*Director of the United States Patent and Trademark Office*